US006587544B2

(12) United States Patent
Nössing et al.

(10) Patent No.: US 6,587,544 B2
(45) Date of Patent: Jul. 1, 2003

(54) METHOD FOR MEASURING A LOAD IMPEDANCE

(75) Inventors: Gerhard Nössing, Villach (AT); David Schwingshackl, Villach (AT); Herbert Zojer, Villach (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/977,727

(22) Filed: Oct. 15, 2001

(65) Prior Publication Data

US 2002/0114428 A1 Aug. 22, 2002

(30) Foreign Application Priority Data

Oct. 17, 2000 (DE) ......................................... 100 51 383

(51) Int. Cl.[7] .............................. H04M 1/24; H04M 3/08
(52) U.S. Cl. .................. 379/26.01; 379/1.01; 379/9.06; 379/24; 379/29.04; 324/500
(58) Field of Search ............................. 379/1.01, 1.04, 379/9.06, 15.01, 22, 22.03, 22.04, 24, 26.01, 27.01, 28, 29.03, 29.04, 30; 340/853.2, 855.7, 310.05; 324/500, 512, 519, 522, 525, 532

(56) References Cited

U.S. PATENT DOCUMENTS

| | | | |
|---|---|---|---|
| 4,449,058 A | * | 5/1984 | Feldmann .................... 307/152 |
| 4,620,069 A | | 10/1986 | Godwin et al. |
| 4,866,767 A | * | 9/1989 | Tanimoto et al. ............ 379/398 |
| 5,305,378 A | | 4/1994 | Svensson |
| 5,440,612 A | * | 8/1995 | Siligoni, deceased et al. .......................... 379/27.01 |
| 5,465,287 A | | 11/1995 | Egozi |
| 5,881,129 A | * | 3/1999 | Chen et al. ............... 379/27.01 |
| 6,144,721 A | * | 11/2000 | Stephens ..................... 379/21 |
| 6,169,784 B1 | * | 1/2001 | Smith ....................... 379/27.01 |
| 6,263,047 B1 | * | 7/2001 | Randle et al. ............ 379/26.01 |

\* cited by examiner

Primary Examiner—Curtis Kuntz
Assistant Examiner—Quoc D Tran
(74) Attorney, Agent, or Firm—Jenkins & Wilson, P.A.

(57) ABSTRACT

Method for measuring a load impedance ($Z_L$) of a load circuit which is connected to an SLIC circuit (6) of an analog terminal connection of a terminal device, having the following steps: specifically a digital toll signal ($x_1$) is generated by means of a Codec circuit (13) connected to the SLIC circuit (6), said toll signal ($x_1$) being converted into an analog toll signal; the analog toll signal is output by the SLIC circuit (6) to the load circuit; an analog voltage which is brought about at the terminal connection (4,5) of the terminal device of the SLIC circuit (6) via the analog toll signal is sensed; the digital toll signal ($x_1$) is filtered by means of an adaptive filter (39) which is provided in the Codec circuit (13) and has adjustable filter coefficients ($g_1$, $g_2$) for generating a filtered digital comparison signal ($y_v$) which is converted into an analog comparison voltage ($U_v$); the filter coefficients ($g_1$, $g_2$) of the adaptive filter (39) are adjusted until the analog comparison voltage ($U_v$) and the analog voltage ($U_L$), brought about by the analog toll signal, at the terminal connection (4, 5) of the terminal device are the same; the complex load impedance ($Z_L$) of the load circuit is calculated as a function of the set filter coefficients ($g_1$, $g_2$)

13 Claims, 2 Drawing Sheets

METHOD FOR MEASURING A LOAD IMPEDANCE

TECHNICAL FIELD

The invention relates to a method for measuring a load impedance of a load circuit connected to an SLIC circuit.

RELATED ART

Analog terminal devices, for example analog telephone terminal devices can be connected to a digital communications network via a two-wire telephone line, an SLIC circuit and a Codec circuit.

The connecting line and the analog terminal device have a complex load impedance ($Z_L$). A possible cable break or a possible line break and the type of connecting line via which the analog terminal device is connected to the SLIC circuit can be detected by measuring the load impedance $Z_L$ of the load circuit.

SUMMARY OF THE INVENTION

The object of the present invention is therefore to provide a method with which the load impedance of a load circuit connected to an SLIC circuit can easily be measured.

This object is achieved according to the invention by means of a method having the features disclosed in claim 1.

The invention provides a method for measuring a load impedance of a load circuit which is connected to an SLIC circuit of an analog terminal connection of a terminal device having the following steps, specifically:

- a digital toll signal is generated by means of a Codec circuit connected to the SLIC circuit, said toll signal being converted into an analog toll signal;
- the analog toll signal is output by the SLIC circuit to the load circuit;
- an analog current which is brought about at the terminal connection of the terminal device via the analog toll signal and is converted into a corresponding voltage is sensed;
- the digital toll signal is filtered by means of an adaptive filter which is provided in the Codec circuit and has adjustable filter coefficients for generating a filtered digital comparison signal which is converted into an analog comparison voltage;
- the filter coefficients of the adaptive filter are adjusted until the analog comparison voltage and the analog voltage, brought about by the analog toll signal, at the terminal connection of the terminal device are the same;
- the complex load impedance of the load circuit is calculated as a function of the set filter coefficients.

The digital toll signal is preferably multiplied in the adaptive filter by a first filter coefficient in order to generate a weighted digital toll signal.

The digital toll signal is preferably phase-shifted in the adaptive filter by means of a phase shifter and is multiplied by a second filter coefficient in order to generate a second weighted digital toll signal.

The first weighted digital toll signal and the second weighted digital toll signal are preferably summed to form the digital comparison signal.

The analog comparison voltage is preferably subtracted from the analog voltage which is brought about at the terminal connection of the terminal device by the analog toll signal in order to generate an analog difference signal.

The analog difference signal is preferably converted into a digital difference signal.

The digital difference signal is preferably multiplied by the digital toll signal and is integrated in order to generate the first filter coefficient of the adaptive filter.

The digital difference signal is preferably multiplied by the phase-shifted digital toll signal and is integrated in order to generate the second filter coefficient of the adaptive filter.

The digital toll signal is phase-delayed by preferably 90° by the phase shifter.

The analog toll signal is preferably a sinusoidal signal.

The sinusoidal toll signal preferably has a frequency of 12 or 16 kHz.

The analog toll signal is preferably amplified by the SLIC circuit.

The complex load impedance of the load circuit is preferably calculated as a function of the first filter coefficient and the second filter coefficient of the adaptive filter and as a function of a constant complex factor.

A preferred embodiment of the method according to the invention for measuring a load impedance of an analog load circuit which is connected to an SLIC circuit is described below with reference to the appended figures in order to explain features which are essential to the invention.

DETAILED DESCRIPTION OF THE INVENTION

Figure 1:
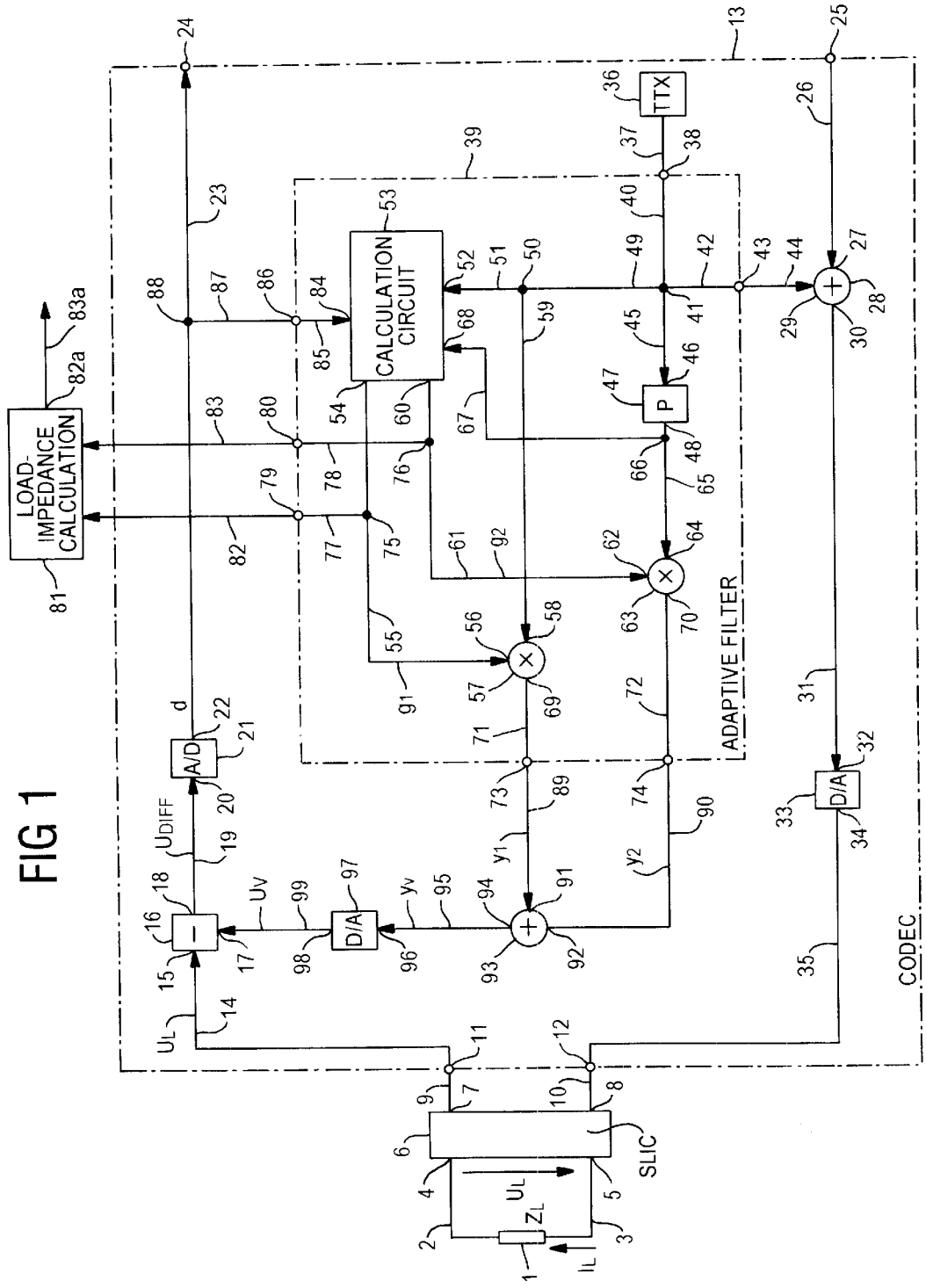
FIG. 1 shows a block circuit diagram of a load circuit which is connected to an SLIC circuit and whose load impedance is measured by means of the method according to the invention.

As is apparent from FIG. 1, the measured load impedance 1 of the load circuit is connected via lines 2, 3 to terminal connections 4, 5 of an SLIC circuit 6. The SLIC circuit 6 is connected via terminal connections 7, 8 and lines 9, 10 to analog terminal connections 11, 12 of a Codec circuit 13. The analog input terminal connection 11 of the Codec circuit 13 is connected via a line 14 to a signal input 15 of a subtractor circuit 16. The subtractor circuit has a further signal input 17 and subtracts the signal present at the signal input 17 from the signal present at the signal input 15. The subtractor circuit 16 has a signal output 18 which is connected via a line 19 to an analog signal input 20 of an analog/digital converter 21. The analog/digital converter 21 converts the analog signal present at the signal input 20 into a digital signal which is output via a signal output 22 and a digital signal line 23 to a signal output 24 of the Codec circuit 13 in order to output a digital transmit signal. The Codec signal 13 is connected via the digital signal output 24 to a digital communications network (not illustrated), for example an ISDN telephone network.

The Codec circuit 13 receives digital data from the communications network via a digital signal terminal connection 25. The digital signal terminal connection 25 of the Codec circuit 13 is connected via a line 26 to a signal input 27 of a summing circuit 28. The summing circuit 28 has a further signal input 29 for receiving a digital toll signal. The digital signal which is present at the signal input 29 and the digital signal at the signal input 27 which originates from the communications network are summed by the summing circuit 28 and output via a signal output 13 of the summing circuit via a line 31 to a digital signal input 32 of a digital/analog converter 33. The digital analog converter converts the digital signal present at the signal input 32 into an analog signal and outputs it via a signal output 34 and a line 35 to the analog terminal connection 12 of the Codec circuit 13. The analog transmit signal which is composed of the analog toll signal and the voice signal originating from the communications network is amplified by the SLIC circuit 6 and output to the load circuit.

The Codec circuit 13 additionally has a TTX generator 36 for generating a sinusoidal signal which is customarily used to meter telephone tolls. The toll signal generated by the TTX generator 36 has a frequency of 12 or 16 kHz. The digital toll signal generated by the TTX generator 36 is fed via a line 37 to a signal input 38 of an adaptive filter 39 which is integrated in the Codec circuit 13. The toll signal is fed from the signal input 38 via a line 40 to a branching node 41 and is conducted from there via a line 42 to a signal output 43 of the adaptive filter 39. The signal output 43 of the adaptive filter 39 is connected via a line 44 to the second signal input 29 of the summing circuit 28. The branching node 41 in the adaptive filter 39 is also connected via line 45 to a signal input 46 of a phase shifter 47. The phase shifter 47 delays the digital toll signal present at the signal input 46 by one adjustable signal phase. The digital toll signal is phase-delayed by preferably 90° by the phase shifter 47 and output after a phase delay via a signal output 48 of the toll meter. The toll signal is applied by the branching node 41 to a further branching node 50 of the adaptive filter 39 via a line 49. The toll signal is fed from the branching node 50 via a line 51 to a signal input 52 of a calculation circuit 53 for calculating filter coefficients of the adaptive filter 39.

The first filter coefficient $g_1$ calculated by the calculation circuit 53 is applied to a signal input 56 of a multiplier circuit 57 via a signal output 54 and a signal line 55. The multiplier circuit 57 has a second signal input 58 which is connected via a line 59 to the second branching node 50.

The second filter coefficient $g_2$ calculated by the calculation circuit 53 is applied to a signal input 62 of a further multiplier circuit 63 via a further signal output 60 of the calculation circuit 53 and a line 61. The multiplier circuit 63 has a further signal input 64 which is connected via a line 65 to the signal output 48 of the phase shifter 47. At a branching node 66, the toll signal which is phase-delayed by the phase shifter 47 is fed via a line 67 to a signal input 68 of the calculation circuit 53. The multiplier circuit 57 and the multiplier circuit 63 each have signal outputs 69, 70 which are connected via lines 71, 72 to signal outputs 73, 74 of the adaptive filter 39.

The calculated filter coefficients $g_1$, $g_2$ which are present on the lines 55, 61, are branched off at branching nodes 75, 76 of the adaptive filter 39 and applied to signal outputs 79, 80 of the adaptive filter 39 via lines 77, 78. A load-impedance-calculating circuit 81 is connected via lines 82, 83 to the signal outputs 79, 80 of the adaptive filter 39. The load-impedance-calculating circuit 81 calculates the load impedance $Z_L$ of the load circuit as a function of the two weighting coefficients $g_1$, $g_2$ which are present on the lines 82, 83 and are calculated by the calculation circuit 53. The load-impedance-calculating circuit 81 is preferably integrated in the Codec circuit 13. In an alternative embodiment, the load-impedance-calculating circuit 81 is connected externally to the Codec circuit 13. The load-impedance-calculating circuit 81 outputs the calculated load impedance $Z_n$ as a value via a signal output 82a and a line 83a for further evaluations at any desired data sink.

In addition, the digital output signal, branched off at a signal input 86 of the adaptive filter 39 via a line 87 and a branching node 88, of the analog/digital converter 21 is fed via a further signal input 84 and a line 85 to the calculation circuit 53 for the calculation of the weighting coefficients or filter coefficients $g_1$, $g_2$.

The output terminal connections 73, 74 of the adaptive filter 39 are connected to signal inputs 91, 92 of a summing circuit 93 via lines 89, 90. The summing circuit 93 sums the weighted toll signals applied by the signal inputs 91, 92 to form a digital comparison signal and outputs the digital comparison signal via a signal output 94 and a line 95 to the one signal input 96 of a digital/analog converter 97. The digital/analog converter 97 converts the digital comparison signal into an analog comparison voltage $U_v$ and outputs the generated comparison voltage via an analog voltage output 98 and a line 99 to the signal input 17 of the subtractor circuit 16.

Figure 2:
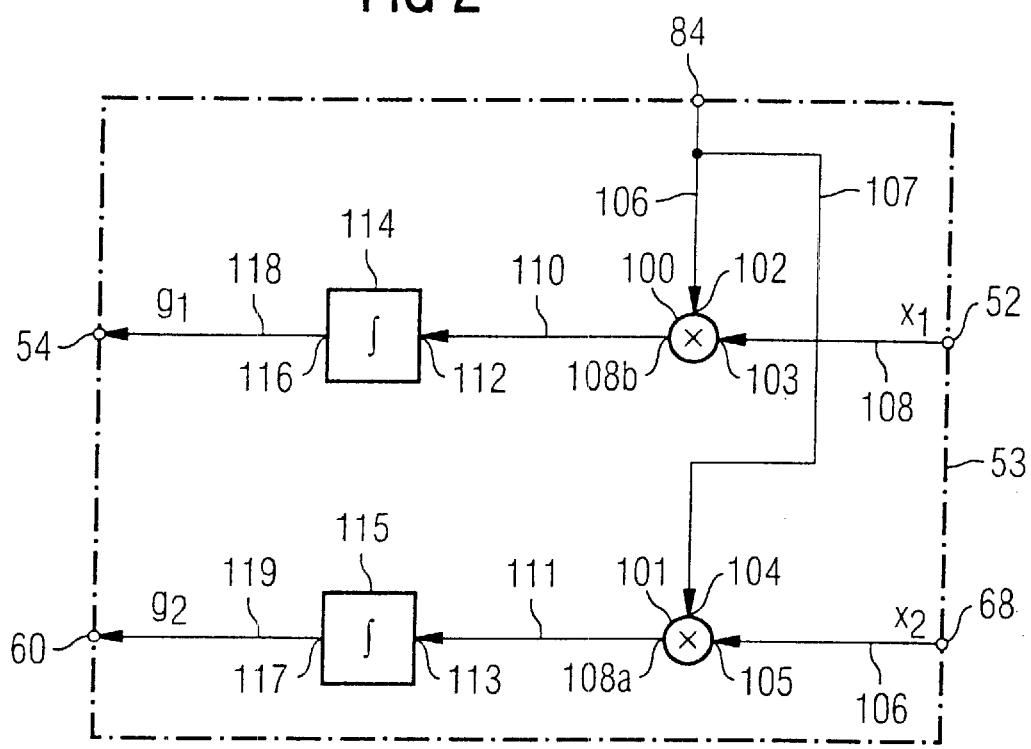
FIG. 2 shows a circuit for calculating the filter coefficients with which the adaptive filter is adjusted in the method according to the invention.

FIG. 2 shows in detail the structure of the calculation circuit 53 which [lacuna] for calculating the filter coefficients of the adaptive filter 39. The calculation circuit 53 contains two multipliers 100, 101, each with two signal inputs 102, 103 and 104, 105, respectively. The first signal input 102, 104 of the two multiplier circuits 100, 101 is connected via lines 106, 107 to the signal input of the calculation circuit 53. The digital difference signal generated by the analog/digital converter 21 is present at the signal input 84. The second signal input 103 of the multiplier circuit 100 is connected via a line 108 to the signal input 52 of the calculation circuit 36 and receives the digital toll signal generated by the TTX generator 63.

The second signal input 105 of the multiplier 101 is connected via a line 106 to the signal input 68 of the calculation circuit 53 and receives the digital toll signal which is phase-delayed by the phase shifter 47.

The two multiplier circuits 100, 101 each have a signal output 100, 109a, 109b which are connected via lines 110, 111 to a signal input 112, 113 of an integrated circuit 114, 115 in order to integrate the output signal. At the output end, the integrated circuits 114, 115 are connected via signal outputs 116, 117 and lines 118, 119 to the output terminal connections 54, 55 of the calculation circuit 53.

The method according to the invention for measuring the load impedance $Z_L$ will be described in detail below on the basis of the block diagrams illustrated in FIGS. 1 and 2.

In the TTX generator 36, a digital toll signal $x_1$ is generated and fed to the phase shifter 47. The phase shifter 47 carries out a phase delay of the digital toll signal $x_1$ of 90° and outputs a phase-delayed toll signal $x_2$:

$$X_2 = -jx_1 \tag{1}$$

The multiplier device 57 multiplies the original toll signal $x_1$ by the filter coefficient $g_1$, which is calculated by the coefficient-calculating circuit 53:

$$y_1 = g_1 * x_2 \tag{2}$$

The multiplier device 63 multiplies the phase-shifted toll signal $x_2$ by a further filter coefficient $g_2$, which is calculated by the coefficient-calculating circuit 53:

$$Y_2 = g_2 * x_2 \tag{3}$$

The summing circuit 91 sums the first weighted toll signal $y_1$ and the second weighted toll signal $y_2$ to form a digital comparison signal $y_v$:

$$y_v = y_1 + y_2 = g_1 x_1 + g_2 x_2 = x_1(g_1 - jg_2) \tag{4}$$

The digital comparison signal $y_v$ is converted by the digital/analog converter 97 into an analog comparison voltage $u_v$ and applied to the signal input 17 of the subtractor circuit 16. The toll signal which is generated by the TTX generator 36 is fed via the summing circuit 28 to the analogue signal input 32 of the digital/analog converter 33 and converted into an analogue toll current signal which is amplified by the SLIC circuit 6 and fed, as an analog toll signal, to the load impedance 1. The load current $i_L$ flows through the load impedance 1 and brings about an analog voltage $U_{IL}$ at the terminal device of the terminal connection 4, 5 of the SLIC circuit 6:

$$U_{IL} = \kappa \cdot \frac{x_1}{Z_L}$$

The SLIC circuit 6 senses the load voltage $U_L$ and outputs the sensed load voltage via the signal terminal connection 11 of the Codec circuit 13 to the signal input 15 of the subtractor circuit 16 contained in the Codec circuit 13.

The subtractor circuit 16 subtracts the analog comparison voltage $U_v$, output by the digital/analog converter 97, from the sensed load voltage $U_L$:

$$U_{DIFF} = U_{IL} - U_v \tag{6}$$

$U_{IL}$ corresponding to the toll current signal received by the SLIC circuit (6).

The difference voltage $U_{DIFF}$ generated by the subtractor circuit 16 is converted into a digital difference signal d by the analog/digital converter 21. The digital difference signal d is fed to the signal input 84 of the calculation circuit 53 and multiplied by the toll signal $x_2$ and the phase-delayed toll signal in order to calculate the filter coefficients $g_1$, $g_2$. The filter coefficients $g_1$, $g_2$ of the adaptive filter 39 are adjusted by the calculation circuit 53 until the digital difference signal d is zero, i.e., until the analogue comparison voltage $U_v$ and the analog voltage $U_L$ brought about by the analog toll signal at the terminal connection 4,5 of the terminal device are the same.

The load impedance $Z_L$ is as follows:

$$Z_L = \kappa * \frac{x_1}{y_v} = k * \frac{x_1}{x_1(g_1 - jg_2)} = k * \frac{1}{g_1 - jg_2} \tag{7}$$

k is a complex factor which takes into account the amplification and the phase rotation of the toll signal by the SLIC circuit 6 and the Codec circuit 13.

The load-impedance-calculating circuit 81 calculates the load impedance $Z_L$ of the load circuit in accordance with the above equation, as a function of the stored complex factor k and the two filter coefficients $g_1$, $g_2$, applied to the lines 82, 83 of the adaptive filter 39.

If the load impedance $Z_L$ is very high, it is possible to infer that there is a cable break in the load circuit. Moreover, given a known capacitance of the connecting lines per length it is possible to infer the position of the cable break by means of the calculated complex load impedance $Z_L$.

In the case of very long lines, the load impedance of the terminal device is negligible in comparison with the load impedance of the connecting lines, so that the following applies:

$$Z_L \cong \frac{1}{j2\pi f C_{line}} \tag{8}$$

Given a known capacitance of the line per length unit $c_L$, the following also applies:

$$c_{line} = c_L * l_{line} \tag{9}$$

In this way, the length of the line up to the cable break can be calculated in accordance with the following equation:

$$l_{line} = \frac{1}{c_L} * \frac{1}{j2\pi f Z_L} \tag{10}$$

$Z_L$ being the calculated complex load impedance, $c_L$ being the capacitance of the line per length unit, and f being the frequency of the toll tone signal which occurs at 12 or 16 kHz.

With the method according to the invention it is easily possible to measure the load impedance $Z_L$ of the load circuit, using the toll signal which is provided by the TTX generator 36 as a toll pulse generator for metering tolls.

What is claimed is:

1. Method for measuring a load impedance ($Z_L$) of a load circuit which is connected to an SLIC circuit of an analog terminal connection of a terminal device, having the following steps:

(a) a digital toll signal ($x_1$) is generated by means of a Codec circuit connected to the SLIC circuit, said toll signal ($x_1$) being converted into an analog toll signal;

(b) the analog toll signal is output by the SLIC circuit to the load circuit;

(c) an analog current which is brought about at the terminal connection of the terminal device of the SLIC circuit via the analog toll signal and is converted into a corresponding voltage is sensed;

(d) the digital toll signal ($x_1$) is filtered by means of an adaptive filter which is provided in the Codec circuit and has adjustable filter coefficients ($g_1$, $g_2$) for generating a filtered digital comparison signal ($y_v$) which is converted into an analog comparison voltage ($U_v$);

(e) the filter coefficients ($g_1$, $g_2$) of the adaptive filter are adjusted until the analog comparison voltage ($U_v$) and the analog voltage ($U_L$), brought about by the analog toll signal, at the terminal connection of the terminal device are the same;

(f) the complex load impedance ($Z_L$) of the load circuit is calculated as a function of the set filter coefficients.

2. Method according to claim 1, wherein the digital toll signal ($x_1$) is multiplied in the adaptive filter by a first filter coefficient ($g_1$) in order to generate a first weighted digital toll signal ($y_1$).

3. Method according to claim 1, wherein the digital toll signal ($x_1$) is phase-shifted in the adaptive filter by means of a phase shifter and is multiplied by a second filter coefficient ($g_2$) in order to generate a second weighted digital toll signal ($y_2$).

4. Method according to claim 2, wherein the first weighted digital toll signal ($y_1$) and the second weighted digital toll signal ($y_2$) are summed to form the digital comparison signal ($y_v$).

5. Method according to claim 1, wherein the analog comparison voltage ($U_v$) is subtracted from the analog voltage ($U_L$) which is brought about at the terminal connection of the terminal device by the analog toll signal in order to generate an analog difference signal ($U_{DIFF}$).

6. Method according to claim 5, wherein the analog difference signal ($U_{DIFF}$) is converted into a digital difference signal (d).

7. Method according to claim 6, wherein the digital difference signal (d) is multiplied by the digital toll signal ($x_1$) and is integrated in order to generate the first filter coefficient ($g_1$) of the adaptive filter.

8. Method according to claim 7, wherein the digital difference signal (d) is multiplied by the phase-shifted digital toll signal ($x_2$) and is integrated in order to generate the second filter coefficient ($g_2$) of the adaptive filter.

9. Method according to claim 1, wherein the digital toll signal ($x_1$) is phase-delayed by 90° by the phase shifter.

10. Method according to claim 1, wherein the toll signal is a sinusoidal signal.

11. Method according to claim 10, wherein the sinusoidal toll signal has a frequency of 12 or 17 kHz.

12. Method according to claim 1, wherein the SLIC circuit amplifies the analog toll signal.

13. Method according to claim 1, wherein the complex load impedance ($Z_L$) of the load circuit is calculated as a function of the first filter coefficient ($g_1$) and the second filter coefficient ($g_2$) of the adaptive filter and as a function of a constant complex factor(k).

* * * * *